US011959866B2

(12) United States Patent
Zou et al.

(10) Patent No.: US 11,959,866 B2
(45) Date of Patent: Apr. 16, 2024

(54) LIVE FLAW DETECTION SYSTEM FOR MULTI-BUNDLED CONDUCTOR SPLICING SLEEVE AND APPLICATION METHOD THEREOF

(71) Applicants: State Grid HuNan Electric Company Limited, Changsha (CN); STATE GRID HUNAN EXTRA HIGH VOLTAGE TRANSMISSION COMPANY, Hengyang (CN); State Grid Corporation of China, Beijing (CN)

(72) Inventors: Dehua Zou, Hengyang (CN); Shasha Peng, Hengyang (CN); Zhipeng Jiang, Hengyang (CN); Zhenyu Wang, Hengyang (CN); Bocheng Li, Hengyang (CN); Qiaosha Xiao, Hengyang (CN); Yurong Xu, Hengyang (CN); Zhenyu Chen, Hengyang (CN); Wenyuan Zeng, Hengyang (CN); Zhiguo Liu, Hengyang (CN)

(73) Assignees: STATE GRID HUNAN ELECTRIC COMPANY LIMITED, Changsha (CN); STATE GRID HUNAN EXTRA HIGH VOLTAGE TRANSMISSION COMPANY, Hengyang (CN); STATE GRID CORPORATION OF CHINA, Beijing (CN)

( * ) Notice: Subject to any disclaimer, the term of this patent is extended or adjusted under 35 U.S.C. 154(b) by 88 days.

(21) Appl. No.: 17/739,211

(22) Filed: May 9, 2022

(65) Prior Publication Data

US 2023/0152247 A1 May 18, 2023

(30) Foreign Application Priority Data

Nov. 18, 2021 (CN) .......................... 202111371715.4

(51) Int. Cl.
*G01N 23/18* (2018.01)
*B64U 101/30* (2023.01)
(Continued)

(52) U.S. Cl.
CPC ........... *G01N 23/18* (2013.01); *G01N 23/083* (2013.01); *G05D 1/0094* (2013.01); *G05D 1/101* (2013.01);
(Continued)

(58) Field of Classification Search
CPC ............ B64U 2101/00; B64U 2101/30; G01N 23/04; G01N 23/18; G01N 23/083;
(Continued)

(56) References Cited

U.S. PATENT DOCUMENTS 9,753,461 B1 * 9/2017 Johnson ................. B64C 39/024
10,613,429 B1 * 4/2020 Wingo ................... G01N 23/00
(Continued)

FOREIGN PATENT DOCUMENTS

CN 109668914 A * 4/2019

OTHER PUBLICATIONS

Translated CN-109668914 (Year: 2019).*

*Primary Examiner* — Dani Fox
*Assistant Examiner* — Soorena Kefayati
(74) *Attorney, Agent, or Firm* — Bayramoglu Law Offices LLC

(57) ABSTRACT

A live flaw detection system for a multi-bundled conductor splicing sleeve and an application method thereof are disclosed. The system includes an upper apparatus and a lower apparatus, where the upper apparatus includes an unmanned aerial vehicle and an industrial X-ray machine, and a laser sensor, and the lower apparatus includes a press plate frame apparatus, vertical screw slide table modules, a horizontal screw slide table module, a projection imager, and a linear
(Continued)

retractable apparatus. The unmanned aerial vehicle functions as a power apparatus that controls the system to be online or offline, the industrial X-ray machine is configured to perform ray flaw detection on each splicing sleeve, the laser sensor is configured to guide the unmanned aerial vehicle to land the lower apparatus on splicing sleeves accurately, and the press plate frame apparatus is configured to fixedly clamp the splicing sleeves.

10 Claims, 5 Drawing Sheets

(51) Int. Cl.
*G01N 23/083* (2018.01)
*G05D 1/00* (2006.01)

(52) U.S. Cl.
CPC .... *B64U 2101/30* (2023.01); *G01N 2223/301* (2013.01); *G01N 2223/646* (2013.01)

(58) Field of Classification Search
CPC ....... G01N 2223/301; G01N 2223/646; G01N 23/00; G01N 2223/40; G01R 31/085; G03B 15/006; G05D 1/101; G05D 1/0094
See application file for complete search history.

(56) References Cited

U.S. PATENT DOCUMENTS

| | | | | |
|---|---|---|---|---|
| 2017/0285092 | A1* | 10/2017 | Moore | G01R 31/085 |
| 2018/0120196 | A1* | 5/2018 | Georgeson | G01N 21/88 |
| 2018/0170414 | A1* | 6/2018 | Arndt | B64C 39/024 |
| 2019/0176984 | A1* | 6/2019 | Wabnegger | G01R 31/085 |
| 2019/0260191 | A1* | 8/2019 | Lavoie | H02G 1/02 |
| 2020/0207488 | A1* | 7/2020 | Troy | B64C 39/024 |
| 2022/0061788 | A1* | 3/2022 | Kobayashi | G05D 1/106 |
| 2022/0185473 | A1* | 6/2022 | King | B64D 43/00 |

\* cited by examiner

LIVE FLAW DETECTION SYSTEM FOR MULTI-BUNDLED CONDUCTOR SPLICING SLEEVE AND APPLICATION METHOD THEREOF

CROSS REFERENCE TO THE RELATED APPLICATIONS

This application is based upon and claims priority to Chinese Patent Application No. 202111371715.4, filed on Nov. 18, 2021, the entire contents of which are incorporated herein by reference.

TECHNICAL FIELD

The present invention relates to the field of live working of a power transmission line, and specifically, to a live flaw detection system for a multi-bundled conductor splicing sleeve and an application method thereof.

BACKGROUND

Under the long-term effect of natural factors such as icing, gallop, or vibration, both the quality of the internal structure and the tensile strength of a splicing sleeve are reduced, which leads to an accident of conductor breaking, thereby seriously threatening safe and stable operation of a power grid. At present, both ground inspection and infrared temperature measurement detection fail to discover flaws of the internal structure of the splicing sleeve. Workers clime up towers and lines to perform detection with power being off; with incomplete radiation resistant measures, the workers are under high security risk. The existing unmanned detection apparatus merely detects scrapes on a single conductor. However, compared with the single conductor, online detection of a multi-bundled power-transmission conductor splicing sleeve has a higher demand.

SUMMARY

An objective of the present invention is to provide a live flaw detection system for a multi-bundled conductor splicing sleeve and an application method thereof that can truly detect flaws of an internal structure of a multi-bundled conductor splicing sleeve.

The live flaw detection system for a multi-bundled conductor splicing sleeve provided in the present invention includes an upper apparatus and a lower apparatus; the upper apparatus includes an unmanned aerial vehicle, an industrial X-ray machine, and a laser sensor; a foot stand is connected to a frame of the unmanned aerial vehicle, the industrial X-ray machine is mounted on the top of the frame with a ray emission end facing downward, and the laser sensor is mounted on the foot stand; the lower apparatus includes a press plate frame apparatus, vertical screw slide table modules, a horizontal screw slide table module, a projection imager, and a linear retractable apparatus; the press plate frame apparatus includes a press plate frame, the press plate frame includes two sets of press plates and two locking apparatuses, the two sets of press plates are connected as a whole through pull rods, the locking apparatuses each include a locking motor and a bracket plate, where the locking motor is arranged with an output shaft perpendicular to the corresponding set of press plates and is fixed on the set of press plates, and the bracket plate is vertically connected to the output shaft of the locking motor; two vertical screw slide table modules are provided, which are arranged with screw slide blocks being opposite to each other, and the tops of slide tables are hinged to the two sets of press plates respectively through respective rotation shafts; a bracket is disposed between the slide blocks of the two vertical screw slide table modules, and the horizontal screw slide table module is fixed on the bracket with a screw slide block facing upward; the projection imager is horizontally mounted on the slide block of the horizontal screw slide table module; the linear retractable apparatus is fixed to a side of one set of press plates, an end of a retractable rod of the linear retractable apparatus is hinged to an upper end of one of the vertical screw slide table modules, and the retractable rod retracts to cause the vertical screw slide table modules to rotate around the respective rotation shafts, to change a position of the projection imager; when the upper apparatus and the lower apparatus are assembled, the foot stand of the unmanned aerial vehicle is fixed to an upper end of the press plate frame; and when the system is fixed on multi-bundled conductors, the press plate frame presses upper conductor splicing sleeves of the multi-bundled conductors, and each bracket plate holds one conductor splicing sleeve and causes the conductor splicing sleeve to be clamped fixedly between the corresponding set of press plates and the bracket plate.

In an embodiment of the foregoing technical solution, the unmanned aerial vehicle is of a hexarotor type.

In an embodiment of the foregoing technical solution, the frame is a rectangular frame, support seats are symmetrically connected to a middle position of the frame along a length direction, a support plate is rotatably connected between the two support seats, a T-shaped hole is provided at a middle position of the support plate, and the emission end of the industrial X-ray machine is placed at the T-shaped hole and is covered and fixed by a cover connected to the support plate.

In an embodiment of the foregoing technical solution, two ends of the support plate are connected to the support seats respectively through a rotation shaft and a bearing, and a micro servo motor is connected to the rotation shaft at one end.

In an embodiment of the foregoing technical solution, each of the press plates is provided with an upper groove and spans across conductors through the upper groove, each set of press plates includes two press plates disposed in parallel, and the two press plates are connected and fixed through a pin shaft and a sleeve outside the pin shaft.

In an embodiment of the foregoing technical solution, an upper edge of each of the bracket plates is provided with a corresponding lower groove matching a diameter of a conductor splicing sleeve.

In an embodiment of the foregoing technical solution, the top of the slide table of each vertical screw slide table module is fixed to an outer side of a corresponding conductor on the corresponding set of press plates, and the top of each vertical screw is connected to an output shaft of a servo motor through a coupler.

In an embodiment of the foregoing technical solution, the bracket is a U-shaped bracket, and two side arms of the bracket are connected and fixed to the slide blocks of the vertical screw slide table modules respectively through fixing elements.

In an embodiment of the foregoing technical solution, one end of a slide table of the horizontal screw slide table module is fixed to a middle position of the bracket, an end of a horizontal screw at the middle position of the bracket is connected to an output shaft of a servo motor through a coupler, and the slide block on the horizontal screw slide table module is connected to a mounting frame for mounting the projection imager.

A method for live flaw detection of a multi-bundled conductor splicing sleeve using the foregoing system provided in the present invention includes the following steps:

(1) assembling the upper apparatus and the lower apparatus respectively, then fixing the foot stand of the unmanned aerial vehicle of the upper apparatus on the pull rods at the top of the press plate frame of the lower apparatus, the vertical screw slide tables of the lower apparatus being in a vertical state;

(2) moving the slide block of the horizontal screw slide table module outward with the projection imager to a position close to the vertical screw slide table modules;

(3) extending the retractable rod of the linear retractable apparatus to cause the two vertical screw slide table modules to rotate outward around the respective rotation shafts mounted on the press plates, where during rotation, the vertical screw slide table modules drive the horizontal screw slide table module and the projection imager to swing to an outer side of the upper grooves of the press plates;

(4) controlling the unmanned aerial vehicle to move to above multi-bundled conductor splicing sleeves, determining a position relationship between the entire system and conductors through the laser sensor, adjusting a position of the unmanned aerial vehicle to land the unmanned aerial vehicle accurately, such that the press plates all span across upper conductor splicing sleeves through the upper grooves at the bottom;

(5) controlling the locking motors on the press plate frame to work, such that the bracket plates rotate upward to hold and lock the conductor splicing sleeves, to fix the entire system stably on the upper conductor splicing sleeves;

(6) retracting the retractable rod of the linear retractable apparatus, such that the vertical screw slide table modules return to the vertical state;

(7) adjusting a position of the projection imager through the vertical screw slide table modules and the horizontal screw slide table module, to cause the projection imager to be located under a first conductor splicing sleeve of the upper conductor splicing sleeves;

(8) adjusting an angle of the industrial X-ray machine, to cause X-ray emitted by the industrial X-ray machine to be projected on the projection imager after passing through the first conductor splicing sleeve, to complete detection of a structure of the first conductor splicing sleeve;

(9) adjusting a horizontal position of the projection imager through the horizontal screw slide table module, such that the projection imager is located under a second conductor splicing sleeve of the upper conductor splicing sleeves; adjusting the angle of the industrial X-ray machine, to cause the X-ray emitted by the industrial X-ray machine to be projected on the projection imager after passing through the second conductor splicing sleeve, to complete detection of a structure of the second conductor splicing sleeve, where similar processes are performed until detection of the upper conductor splicing sleeves are completed;

(10) repeating steps (3) and (6);

(11) completing detection of each conductor splicing sleeve of lower conductor splicing sleeves with reference to steps (7)-(9);

(12) repeating step (3);

(13) controlling the locking motors on the press plate frame to work reversely, such that the bracket plates rotate downward to unlock the conductor splicing sleeves; and

(14) controlling the unmanned aerial vehicle to return, to complete the entire detection process.

The unmanned aerial vehicle of the upper apparatus of the present invention functions as a power apparatus that controls the entire system to be online or offline, the industrial X-ray machine disposed on the unmanned aerial vehicle is configured to perform ray flaw detection on each conductor splicing sleeve, and the laser sensor disposed on the unmanned aerial vehicle is configured to guide the unmanned aerial vehicle to land the lower apparatus of the system on the conductor splicing sleeves accurately. After the lower apparatus is landed on the conductor splicing sleeves, the press plates and the locking apparatuses of the press plate frame cooperate with the bracket plates to clamp the conductor splicing sleeves, such that the entire system is fixed stably on the conductor splicing sleeves. When an angle of the industrial X-ray machine is adjusted to perform X-ray flaw detection on different conductor splicing sleeves, the vertical screw slide table modules and the horizontal screw slide table module cooperate with the linear retractable apparatus of the lower apparatus to flexibly adjust the projection imager to be located at an appropriate position, such that the X-ray is projected on the projection imager to complete detection of an internal structure of each conductor splicing sleeve, and whether the internal structure of the splicing sleeve has a flaw or not is determined accurately based on an image of the projection imager. This can resolve the problem that current means such as daily inspection, infrared temperature measurement detection, power-off detection by a worker, and scape inspection on a single conductor are not adapted to flow detection of internal structures of multi-bundled conductor splicing sleeves.

DETAILED DESCRIPTION OF THE EMBODIMENTS

Figure 1:
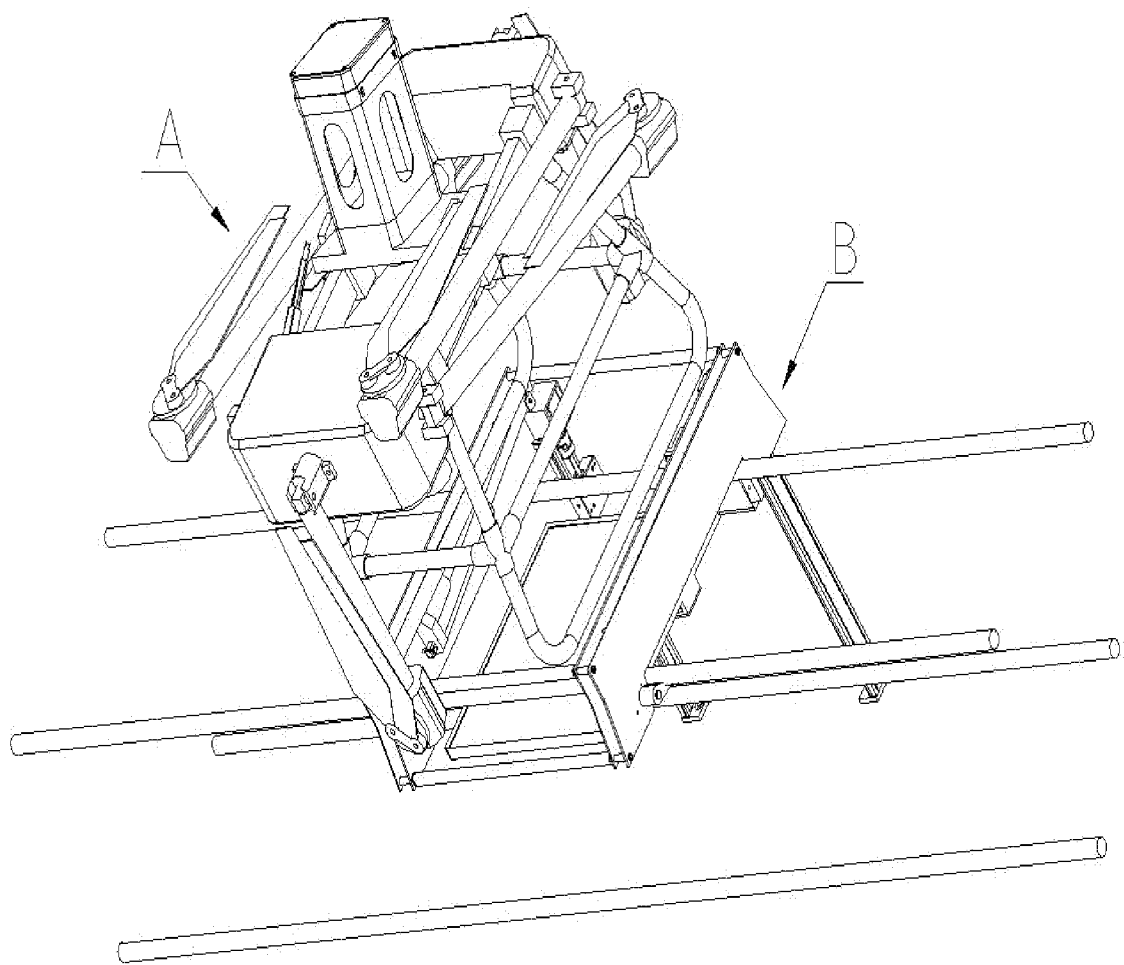
FIG. 1 is an axonometric view of an embodiment of the present invention in a use state.
Figure 2:
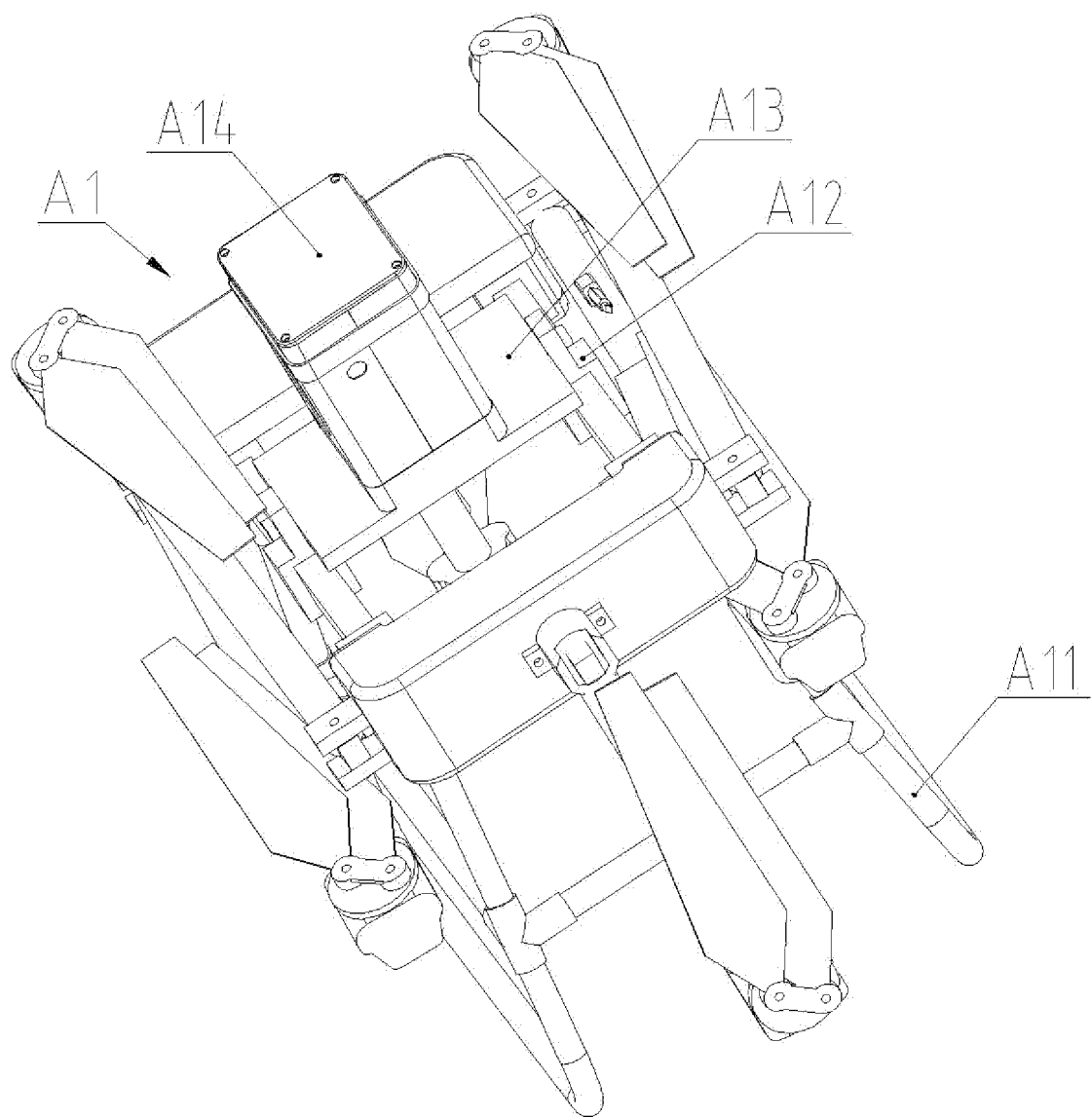
FIG. 2 is an enlarged axonometric view of an upper apparatus in FIG. 1.
Figure 3:
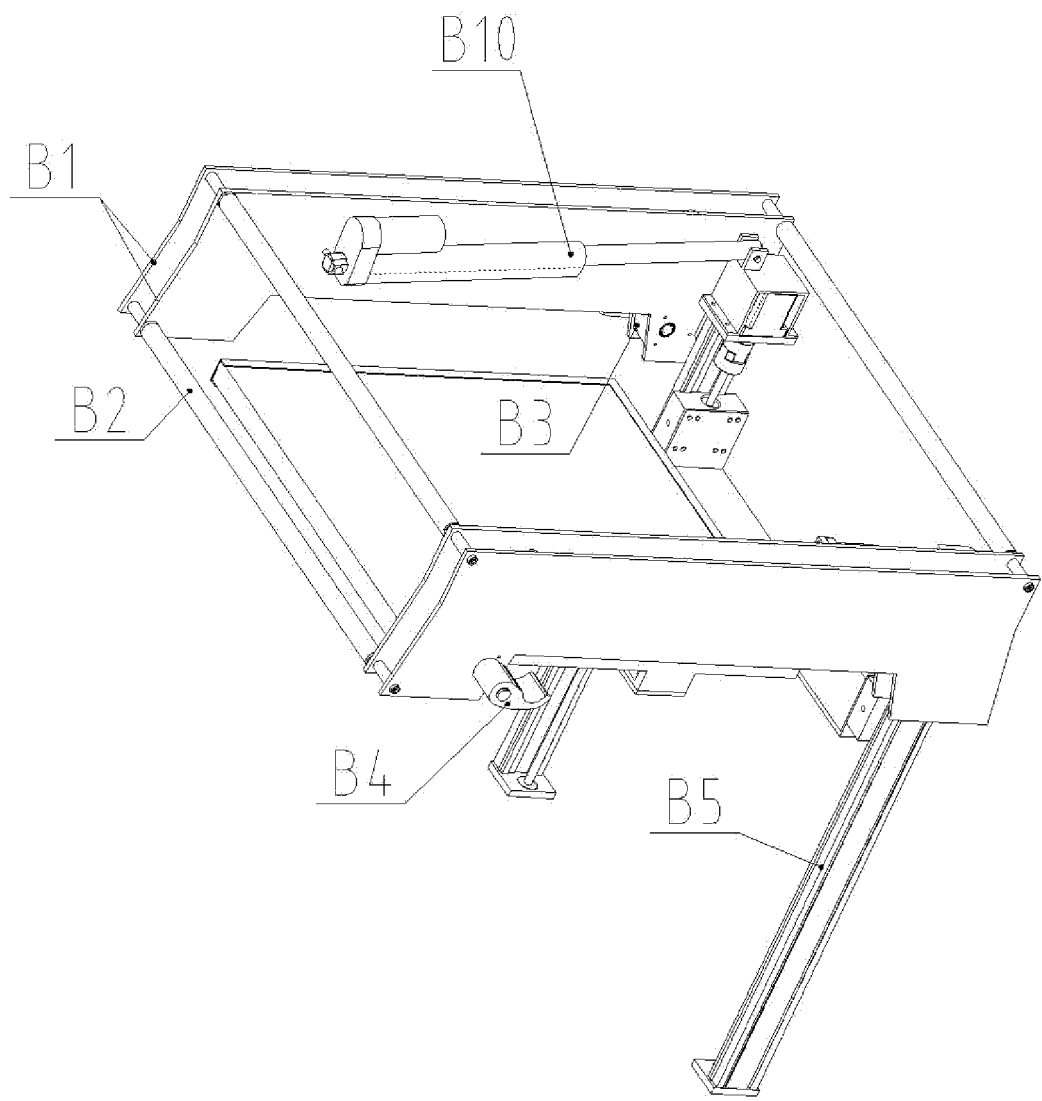
FIG. 3 to FIG. 5 are enlarged axonometric views of a lower apparatus in FIG. 1 from different orientations.
Figure 4:
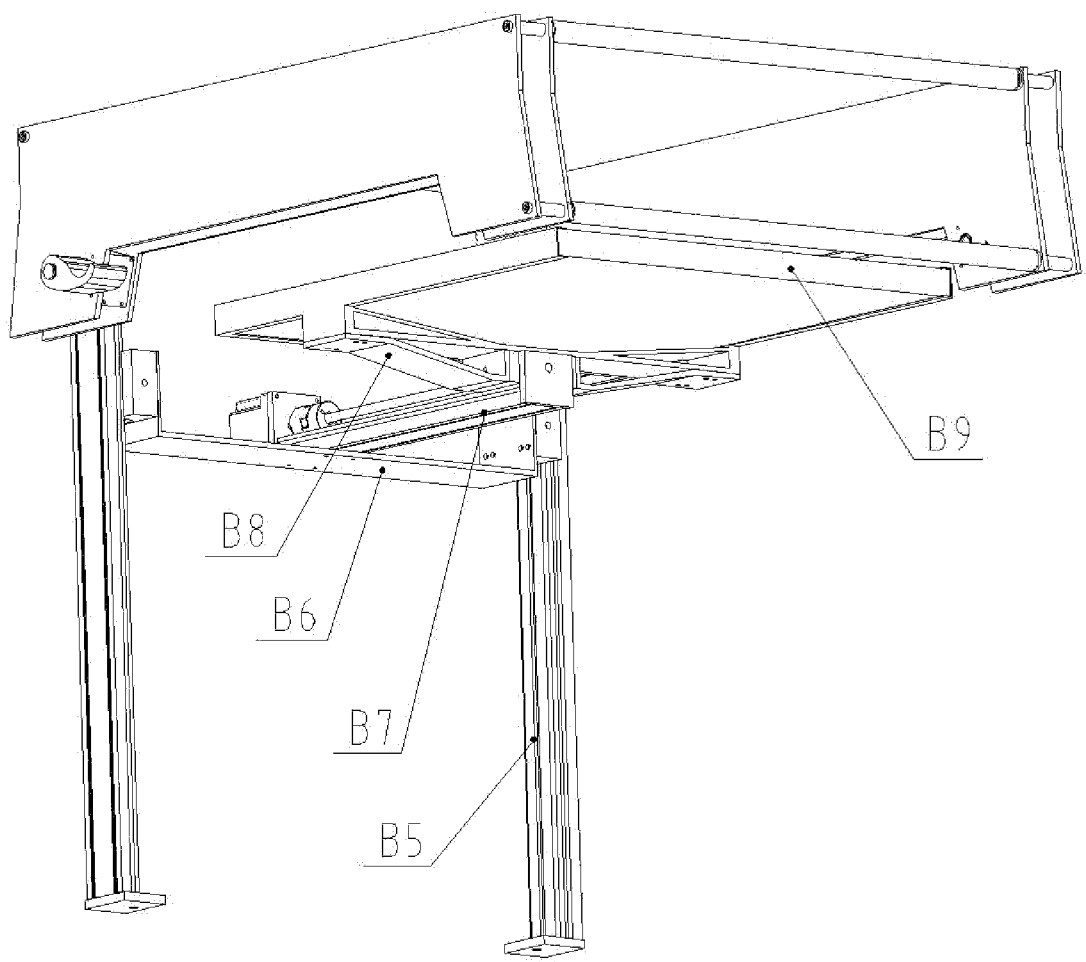
Figure 5:
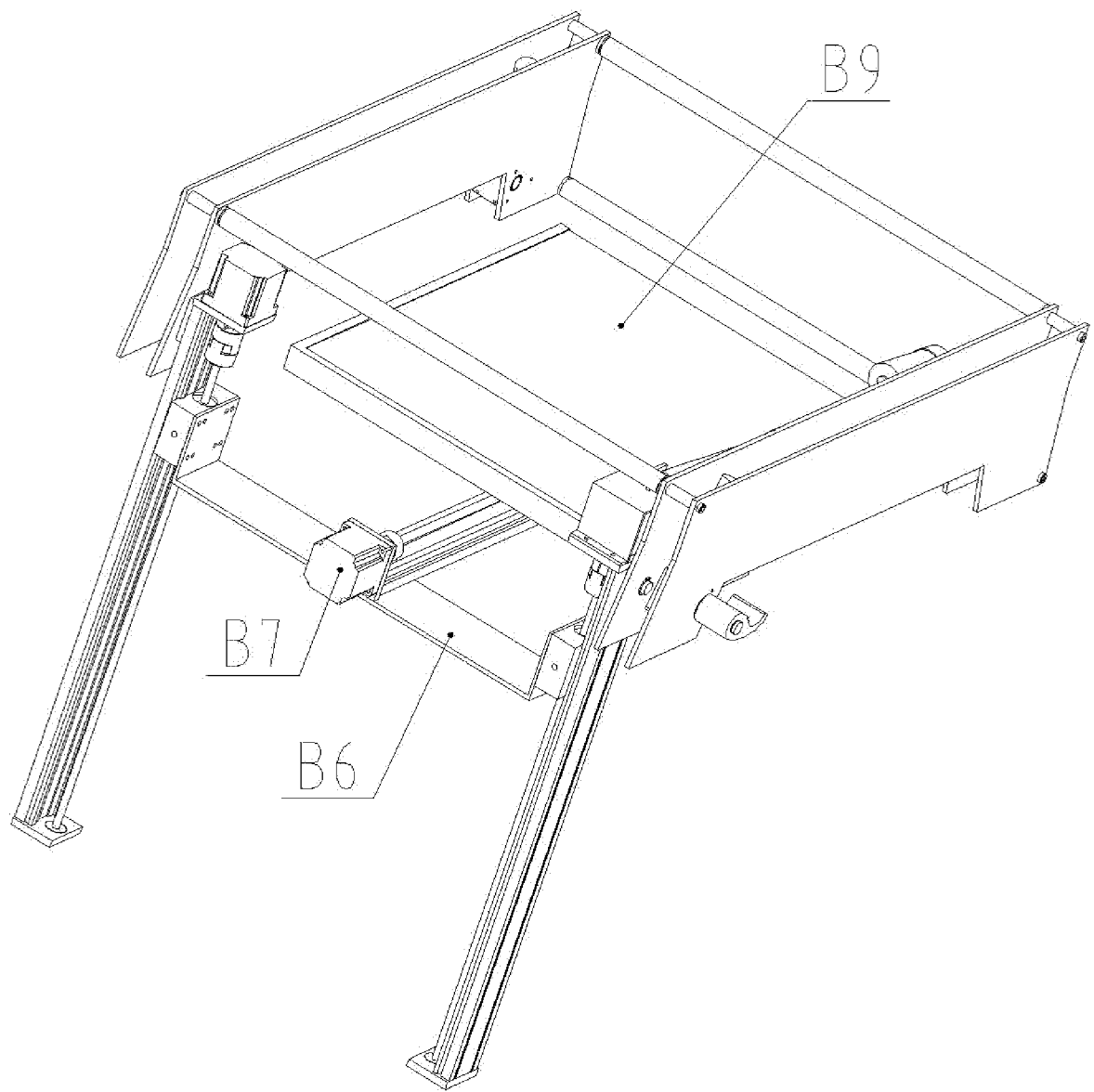

As shown in FIG. 1, a live flaw detection system for a multi-bundled conductor splicing sleeve disclosed by this embodiment includes an upper apparatus A and a lower apparatus B.

The upper apparatus A mainly includes a hexarotor unmanned aerial vehicle, an industrial X-ray machine, and a laser sensor.

A frame of the hexarotor unmanned aerial vehicle A1 is a rectangular frame, a foot stand A11 is symmetrically connected to two sides of the rectangular frame along a length direction, support seats A12 are symmetrically connected to a middle position of the frame along the length direction, a support plate A13 is rotatably connected between the two support seats, and a T-shaped hole is provided at a central position of the support plate. An emission end of the industrial X-ray machine is arranged at the T-shaped hole, and is covered and fixed by a cover A14 connected to the support plate.

Two ends of the support plate A13 are connected to the support seats A12 respectively through a rotation shaft and a bearing, the rotation shaft at one end is connected to a micro servo motor (not shown in the figure), the support plate is driven by the servo motor to adjust an angle of the industrial X-ray machine, to cause the industrial X-ray machine to adjust the angle as needed.

The laser sensor is fixed to an appropriate position on the foot stand, and is not shown in the figure.

The lower apparatus B includes a press plate frame apparatus, vertical screw slide table modules, a horizontal screw slide table module, a projection imager, and a linear retractable apparatus.

The press plate frame apparatus includes a press plate frame, and the press plate frame includes two sets of press plates and two locking apparatuses.

Each set of press plates includes two press plates B1 disposed in parallel, and the two press plates are connected and fixed through a pin shaft and a sleeve outside the pin shaft, a lower end of each of the press plates B1 is provided with an upper groove as a groove for spanning across conductor splicing sleeves.

The two sets of press plates are connected as a whole through pull rods B2.

The locking apparatuses each include a locking motor B3 and a bracket plate B4, where the locking motor is arranged with an output shaft being perpendicular to the corresponding set of press plates B1 and is fixed on the corresponding set of press plates, and the bracket plate is vertically connected to the output shaft of the locking motor. An upper edge of each of the bracket plates B4 is provided with a lower groove matching a diameter of a conductor splicing sleeve.

The two locking apparatuses are connected to diagonal angles of the two sets of press plates.

Two vertical screw slide table modules B5 are provided, which are arranged with screw slide blocks being opposite to each other. The tops of slide tables are hinged to portions at the same end of inner press plates of the two sets of the press plates through respective rotation shafts, and the top of each vertical screw is connected to an output shaft of the servo motor through a coupler.

A bracket B6 is disposed between the slide blocks of the two vertical screw slide table modules B5. The bracket is a U-shaped bracket, where two side arms of the bracket are connected and fixed to the slide blocks of the vertical screw slide table modules respectively through fixing elements.

A horizontal screw slide table module B7 is fixed on the bracket B6 with a screw slide block facing upward.

One end of a slide table of the horizontal screw slide table module B7 is fixed to a middle position of the bracket B6, an end of a horizontal screw at the middle position of the bracket is connected to the output shaft of the servo motor through a coupler, and the slide block on the horizontal screw slide table module is connected to a mounting frame B8.

A projection imager B9 is fixed horizontally on the mounting frame B8.

A linear retractable apparatus B10 adopts a linear actuator and is fixed to a side of an inner press plate of one set of press plates, where an end of a retractable rod of the linear retractable apparatus is hinged to an upper end of one vertical screw slide table module B5, and the retractable rod retracts to cause the two vertical screw slide table modules to rotate around respective rotation shafts at the same time, to change a position of the projection imager B9.

When the upper apparatus A and the lower apparatus B are assembled, the foot stand of the hexarotor unmanned aerial vehicle is fixed to the pull rods on the top of the press plate frame, and the vertical screw slide table modules are in a vertical state.

The hexarotor unmanned aerial vehicle functions as a power apparatus that controls the system to be online or offline. The industrial X-ray machine disposed on the hexarotor unmanned aerial vehicle is configured to perform ray flaw detection on each conductor splicing sleeve, and the laser sensor disposed on the hexarotor unmanned aerial vehicle is configured to guide the unmanned aerial vehicle to land the system on the conductor splicing sleeves accurately.

The entire process of going online and being fixed and a specific flaw detection process of the system is as follows:

(1) moving the slide block of the horizontal screw slide table module outward with the projection imager to a position close to the vertical screw slide table modules;

(2) extending the retractable rod of the linear actuator to cause the two vertical screw slide table modules to rotate outward around the respective rotation shafts mounted on the press plates, where during rotation, the vertical screw slide table modules drive the horizontal screw slide table module and the projection imager to swing to an outer side of the upper grooves of the press plates;

(3) controlling the unmanned aerial vehicle to move to above multi-bundled conductor splicing sleeves, determining a position relationship between the entire system and conductors through the laser sensor, adjusting a position of the unmanned aerial vehicle to land the unmanned aerial vehicle accurately, such that the press plates all span across upper conductor splicing sleeves through the upper grooves at the bottom;

(4) controlling the locking motors on the press plate frame to work, such that the bracket plates rotate upward to hold and lock the conductor splicing sleeves, to fix the entire system stably on the upper conductor splicing sleeves;

(5) retracting the retractable rod of the linear actuator, such that the vertical screw slide table modules return to the vertical state;

(6) adjusting the horizontal screw slide table module to be located under the upper conductor splicing sleeve through the vertical screw slide table modules, adjusting a position of a projection image through the horizontal screw slide table module, to cause the projection imager to be located under a first conductor splicing sleeve of the upper conductor splicing sleeve;

(7) working, by the servo motor connected to the rotation shaft at an end of the support plate connected to the vehicle framework of the unmanned aerial vehicle, adjusting an angle of the industrial X-ray machine, to cause an X-ray emitted by the industrial X-ray machine to be projected on the projection imager after passing through the first conductor splicing sleeve, to complete detection of an internal structure of the first conductor splicing sleeve;

(8) adjusting a horizontal position of the projection imager through the horizontal screw slide table module, such that the projection imager is located under a second conductor splicing sleeve of the upper conductor splicing sleeves; adjusting the angle of the industrial X-ray machine, to cause the X-ray emitted by the industrial X-ray machine to be projected on the projection imager after passing through the second conductor splicing sleeve, to complete detection of a structure of the second conductor splicing sleeve, where similar processes are performed until detection of the upper conductor splicing sleeves are completed;
(9) repeating steps (2) and (5);
(10) completing detection of each conductor splicing sleeve of lower conductor splicing sleeves with reference to steps (6)-(8);
(11) repeating step (2);
(12) controlling the locking motors on the press plate frame to work reversely, such that the bracket plates rotate downward to unlock the conductor splicing sleeves; and
(13) controlling the unmanned aerial vehicle to return, to complete the entire detection process.

What is claimed is:

1. A live flaw detection system for a multi-bundled conductor splicing sleeve, said system comprising:
an upper apparatus; and
a lower apparatus, wherein
the upper apparatus comprises an unmanned aerial vehicle, an industrial X-ray machine, and a laser sensor, wherein a foot stand is connected to a frame of the unmanned aerial vehicle, the industrial X-ray machine is mounted on a top of the frame of the unmanned aerial vehicle with a ray emission end facing downward, and the laser sensor is mounted on the foot stand,
the lower apparatus comprises a press plate frame apparatus, two vertical screw slide table modules, a horizontal screw slide table module, a projection imager, and a linear retractable apparatus,
the press plate frame apparatus comprises a press plate frame, the press plate frame comprises two sets of press plates and two locking apparatuses, the two sets of press plates are connected as a whole through pull rods, and each of the two locking apparatuses comprises a locking motor and a bracket plate, wherein the locking motor is arranged with an output shaft being perpendicular to a corresponding set of the two sets of press plates and the locking motor is fixed on the corresponding set of the two sets of press plates, and the bracket plate is vertically connected to the output shaft of the locking motor,
the two vertical screw slide table modules are arranged with screw slide blocks of the two vertical screw slide table modules being opposite to each other, and tops of slide tables of the two vertical screw slide table modules are hinged to the two sets of press plates respectively through respective first rotation shafts,
a bracket is disposed between the screw slide blocks of the two vertical screw slide table modules, and the horizontal screw slide table module is fixed on the bracket with a screw slide block of the horizontal screw slide table module facing upward,
the projection imager is horizontally mounted on the screw slide block of the horizontal screw slide table module,
the linear retractable apparatus is fixed to a side of one set of the two sets of press plates, wherein the linear apparatus includes a retractable rod and an end of the retractable rod of the linear retractable apparatus is hinged to an upper end of one of the two vertical screw slide table modules, the retractable rod retracts to cause the two vertical screw slide table modules to rotate around the respective first rotation shafts, to change a position of the projection imager, when the upper apparatus and the lower apparatus are assembled, the foot stand of the unmanned aerial vehicle is fixed to a top of the press plate frame, and
when the live flaw detection system is fixed on multi-bundled conductors, the press plate frame presses upper multi-bundled conductor splicing sleeves of the multi-bundled conductors, and each bracket plate holds one of the upper multi-bundled conductor splicing sleeves and causes the one of the upper multi-bundled conductor splicing sleeves to be clamped fixedly between the corresponding set of the two sets of press plates and the bracket plate.

2. The live flaw detection system according to claim 1, wherein the unmanned aerial vehicle is of a hexarotor type.

3. The live flaw detection system according to claim 1, wherein the frame of the unmanned aerial vehicle is a rectangular frame, two support seats are symmetrically connected to a middle position of the rectangular frame along a length direction, a support plate is rotatably connected between the two support seats, a T-shaped hole is provided at a middle position of the support plate, and the ray emission end of the industrial X-ray machine is placed at the T-shaped hole and is covered and fixed by a cover connected to the support plate.

4. The live flaw detection system according to claim 1, wherein each of the two sets of press plates is provided with an upper groove and each of the two sets of press plates spans across the multi-bundled conductors through the upper groove, each of the two sets of press plates comprises two press plates disposed in parallel, and the two press plates are connected and fixed through a pin shaft and a sleeve outside the pin shaft.

5. The live flaw detection system according to claim 1, wherein an upper edge of each of the bracket plates is provided with a lower groove matching a diameter of the upper multi-bundled conductor splicing sleeves.

6. The live flaw detection system according to claim 1, wherein the top of the slide table of each of the two vertical screw slide table modules is fixed to an outer side of a corresponding multi-bundled conductor on the corresponding set of the two sets of press plates, and a top of each vertical screw is connected to an output shaft of a servo motor through a coupler.

7. The live flaw detection system according to claim 1, wherein the bracket is a U-shaped bracket, and two side arms of the bracket are connected and fixed to the screw slide blocks of the two vertical screw slide table modules respectively through fixing elements.

8. A method for a live flaw detection of a multi-bundled conductor splicing sleeve using the live flaw detection system according to claim 1, the method comprising the steps of:
(1) assembling the upper apparatus and the lower apparatus respectively, and fixing the foot stand of the unmanned aerial vehicle of the upper apparatus on the pull rods at the top of the press plate frame of the lower apparatus, wherein the slide tables of the two vertical screw slide table modules of the lower apparatus are in a vertical state;
(2) moving the screw slide block of the horizontal screw slide table module outward with the projection imager to a position close to the two vertical screw slide table modules;
(3) extending the retractable rod of the linear retractable apparatus to cause the two vertical screw slide table modules to rotate outward around the respective first rotation shafts mounted on the two sets of press plates, wherein during a rotation, the two vertical screw slide table modules drive the horizontal screw slide table module and the projection imager to swing to an outer side of upper grooves of the two sets of press plates;
(4) controlling the unmanned aerial vehicle to move to above the upper multi-bundled conductor splicing sleeves, determining a position relationship between an entirety of the live flaw detection system and the multi-bundled conductors through the laser sensor and adjusting a position of the unmanned aerial vehicle to land the unmanned aerial vehicle accurately such that the two sets of press plates all span across the upper multi-bundled conductor splicing sleeves through the upper grooves at bottoms of the two sets of press plates;
(5) controlling the locking motors on the press plate frame to work such that the bracket plates rotate upward to hold and lock the upper multi-bundled conductor splicing sleeves to fix the entirety of the live flaw detection system stably on the upper multi-bundled conductor splicing sleeves;
(6) retracting the retractable rod of the linear retractable apparatus, such that the two vertical screw slide table modules return to the vertical state;
(7) adjusting a position of the projection imager through the two vertical screw slide table modules and the horizontal screw slide table module to cause the projection imager to be located under a first upper multi-bundled conductor splicing sleeve of the upper multi-bundled conductor splicing sleeves;
(8) adjusting an angle of the industrial X-ray machine, to cause an X-ray emitted by the industrial X-ray machine to be projected on the projection imager after passing through the first upper multi-bundled conductor splicing sleeve to complete a detection of a structure of the first upper multi-bundled conductor splicing sleeve;
(9) adjusting a horizontal position of the projection imager through the horizontal screw slide table module such that the projection imager is located under a second upper multi-bundled conductor splicing sleeve of the upper multi-bundled conductor splicing sleeves;
adjusting the angle of the industrial X-ray machine to cause the X-ray emitted by the industrial X-ray machine to be projected on the projection imager after passing through the second upper multi-bundled conductor splicing sleeve to complete a detection of a structure of the second upper multi-bundled conductor splicing sleeve, wherein similar processes are performed until a detection of the upper multi-bundled conductor splicing sleeves are completed;
(10) repeating the steps of extending the retractable rod and retracting the retractable rod;
(11) completing a detection of each of lower multi-bundled conductor splicing sleeves of the multi-bundled conductors with reference to the steps of adjusting the position of the projection imager, adjusting the angle of the industrial X-ray machine and adjusting the horizontal position of the projection imager;
(12) repeating the step of extending the retractable rod;
(13) controlling the locking motors on the press plate frame to work reversely, such that the bracket plates rotate downward to unlock the upper and lower multi-bundled conductor splicing sleeves; and
(14) controlling the unmanned aerial vehicle to return, to complete an entire detection process.

9. The live flaw detection system according to claim 3, wherein two ends of the support plate are connected to the two support seats respectively through a second rotation shaft and a bearing, and a micro servo motor is connected to the second rotation shaft at one end.

10. The live flaw detection system according to claim 7, wherein one end of a slide table of the horizontal screw slide table module is fixed to a middle position of the bracket, an end of a horizontal screw at the middle position of the bracket is connected to an output shaft of a servo motor through a coupler, and the screw slide block on the horizontal screw slide table module is connected to a mounting frame for mounting the projection imager.

* * * * *